(12) United States Patent
Kerr et al.

(10) Patent No.: US 8,015,702 B2
(45) Date of Patent: Sep. 13, 2011

(54) METAL SUBSTRATE HAVING ELECTRONIC DEVICES FORMED THEREON

(75) Inventors: Roger S. Kerr, Brockport, NY (US); Timothy J. Tredwell, Fairport, NY (US); Mark A. Harland, Hilton, NY (US)

(73) Assignee: Carestream Health, Inc., Rochester, NY (US)

( * ) Notice: Subject to any disclaimer, the term of this patent is extended or adjusted under 35 U.S.C. 154(b) by 71 days.

(21) Appl. No.: 12/694,490

(22) Filed: Jan. 27, 2010

(65) Prior Publication Data

US 2010/0129945 A1 May 27, 2010

Related U.S. Application Data

(63) Continuation of application No. 11/553,018, filed on Oct. 26, 2006, now Pat. No. 7,913,381.

(51) Int. Cl.
*H05K 3/30* (2006.01)
*H05K 3/36* (2006.01)
*H05K 3/02* (2006.01)
*H05K 3/10* (2006.01)
*H01L 21/30* (2006.01)
*H01L 21/46* (2006.01)

(52) U.S. Cl. ........... 29/832; 29/830; 29/846; 438/455

(58) Field of Classification Search ........... 29/830, 29/832, 846; 438/455–459
See application file for complete search history.

(56) References Cited

U.S. PATENT DOCUMENTS

| | | | | |
|---|---|---|---|---|
| 2,318,592 A * | 5/1943 | Cupery | | 205/273 |
| 2,433,441 A * | 12/1947 | Davidoff | | 205/77 |
| 6,083,835 A * | 7/2000 | Shue et al. | | 438/687 |
| 7,259,106 B2 * | 8/2007 | Jain | | 438/737 |
| 2004/0029364 A1 * | 2/2004 | Aoki et al. | | 438/478 |
| 2004/0087066 A1 * | 5/2004 | Voutsas | | 438/147 |
| 2006/0006528 A1 * | 1/2006 | Kujirai et al. | | 257/730 |
| 2006/0011917 A1 * | 1/2006 | Koo et al. | | 257/66 |
| 2006/0071215 A1 * | 4/2006 | Arao et al. | | 257/72 |
| 2006/0072049 A1 * | 4/2006 | Song | | 349/43 |
| 2006/0127817 A1 * | 6/2006 | Ramanujan et al. | | 430/320 |
| 2008/0026581 A1 * | 1/2008 | Tredwell et al. | | 438/691 |
| 2008/0115350 A1 * | 5/2008 | Kerr et al. | | 29/832 |

FOREIGN PATENT DOCUMENTS

| | | |
|---|---|---|
| DE | 12 15 763 B | 5/1966 |
| DE | 100 06 823 A1 | 8/2001 |
| GB | 1 053 304 A | 12/1966 |
| GB | 2 091 634 A | 8/1982 |
| WO | WO 01/63016 A1 | 8/2001 |

OTHER PUBLICATIONS

T. Afentakis et al., "Polysilicon TFT AM-OLED on Thin Flexible Metal Substrates," Proceedings of the SPIE, SPIE, Bellingham, VA, vol. 5004, May 2003, pp. 187-191, XP002404201.

Alex Z. Kattamis et al., "AMOLED Backplanes of Amorphous Silicon on Steel Foils," Proceedings, International Display Research Conference SID 2006; 9.3.

* cited by examiner

*Primary Examiner* — A. Dexter Tugbang
*Assistant Examiner* — David Angwin

(57) ABSTRACT

A method of forming an electronic device on a metal substrate deposits a first seed layer of a first metal on at least one master surface with a roughness less than 400 nm. A supporting metal layer is bonded to the first seed layer to form the metal substrate 10. The metal substrate is removed from the master surface, and at least one electronic device is formed on the seed layer of the metal substrate.

20 Claims, 15 Drawing Sheets

METAL SUBSTRATE HAVING ELECTRONIC DEVICES FORMED THEREON

CROSS REFERENCE TO RELATED APPLICATIONS

This is a Continuation of U.S. Ser. No. 11/553,018 filed on Oct. 26, 2006 now U.S. Pat. No. 7,913,381, entitled METAL SUBSTRATE HAVING ELECTRONIC DEVICES FORMED THEREON, by Kerr et al.

Reference is made to U.S. Ser. No. 12/694,471 filed on even date, entitled METAL SUBSTRATE HAVING ELECTRONIC DEVICES FORMED THEREON, by Kerr et al. which is also a Continuation of U.S. Ser. No. 11/553,018 filed on Oct. 26, 2006, entitled METAL SUBSTRATE HAVING ELECTRONIC DEVICES FORMED THEREON, by Kerr et al., published as US 2008/0115350, incorporated herein by reference.

Reference is made to U.S. patent application Ser. No. 11/461,080, filed Jul. 31, 2006, entitled FLEXIBLE SUBSTRATE WITH ELECTRONIC DEVICES FORMED THEREON, by Tredwell at al., published as US 2008/0026581, the disclosure of which is incorporated herein.

FIELD OF THE INVENTION

This invention generally relates to electronic devices and more particularly relates to electronic device fabricated on a metal substrate.

BACKGROUND OF THE INVENTION

Thin-film transistor (TFT) devices are widely used in switching or driver circuitry for electro-optical arrays and display panels. TFT devices are conventionally fabricated on rigid substrates, typically glass or silicon, using a well-known sequence of deposition, patterning and etching steps. For example, amorphous silicon TFT devices require deposition, patterning, and etching of metals, such as aluminum, chromium or molybdenum, of amorphous silicon semiconductors, and of insulators, such as SiO2 or Si3N4 onto a substrate. The semiconductor thin film is formed in layers having typical thicknesses of from several nm to several hundred nm, with intermediary layers having thicknesses on the order of a few microns, and may be formed over an insulating surface that lies atop the rigid substrate.

The requirement for a rigid substrate is based largely on the demands of the fabrication process itself. Thermal characteristics are of particular importance, since TFT devices are fabricated at relatively high temperatures. Thus, the range of substrate materials that have been used successfully is somewhat limited, generally to glass, quartz, or other rigid, silicon-based materials. Among other problems, the limitations inherent to these substrates frustrate efforts to fabricate larger displays and devices, since crystalline silicon and many types of glass that are conventionally employed as substrates become increasingly difficult to form and manage in large, thin, lightweight sheets.

Clearly, there would be advantages in expanding the range of suitable substrate materials for the formation of electronic devices. As part of the effort to extend the range of possible substrates, TFT devices have been formed on some types of metal foil substrates. Metal substrates are advantaged for reduced weight, efficient thermal dissipation, and overall robustness when exposed to mechanical stress, flexing, or shock. It has been recognized that their overall thermal, dimensional, and chemical stability makes metal foil substrates a desirable substrate for electronic devices such as active matrix organic light-emitting diode (AMOLED) transistor backplanes that are conventionally formed on glass or silicon. However, problems with surface morphology, resulting in increased capacitive coupling, edge effects, and possible shorting between layered components formed thereon, make metal foil substrates difficult to fabricate for use with AMOLED or other thin-film devices. Thus, while they exhibit many desirable properties and offer significant potential for lightweight component designs, metal substrates have yet to be shown as practical replacements for glass or silicon wafer materials.

One major hurdle with conventional approaches to providing and preparing a metal substrate suitable for thin-film device fabrication thereon relates to surface characteristics using existing surface treatment techniques. High quality stainless steel, for example, can be roll-formed to provide a surface that is smooth to within about 1.4 to 2 microns peak-to-peak. However, for thin-film devices, smoothness of at least no more than 400 nm, more preferably no more than about 200-300 nm peak-to-peak is desirable. Any rougher surface would require an excessively thick planarization layer, more likely subject to cracking and other defects. While there are adaptable wafer-surface treatment techniques for smoothing the surface, such as chemical-mechanical polishing (CMP), such techniques are very costly and are limited in treatment surface area. Another difficulty with conventional techniques are relatively high defect rates.

For these reasons, the potential advantages metal substrates would offer for thin-film device formation have yet to be realized. It can, therefore, be appreciated that there is a need for an economical method for forming a metal substrate with a surface smoothness that allows fabrication of TFT electronic devices thereon.

SUMMARY OF THE INVENTION

The present invention provides a method of forming an electronic device on a metal substrate comprising: depositing a first seed layer of a first metal on at least one master surface with a roughness less than 400 nm; bonding a supporting metal layer to the first seed layer to form the metal substrate; removing said metal substrate from the master surface; and forming at least one electronic device on the seed layer of the metal substrate.

It is a feature of the present invention that it forms and uses a seed layer that has been formed onto a very smooth master surface.

It is an advantage of the present invention that it provides a thin metal substrate having a high degree of smoothness without the need for extensive surface treatment.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

DETAILED DESCRIPTION OF THE INVENTION

The method of the present invention allows the formation of thin-film electronic devices on a metal substrate by first forming a seed layer by depositing metal onto a very smooth master surface. One or more successive metals layers are then bonded to this seed layer as support structure. The multi-layered metal substrate that is thus formed can then be detached from the master to provide the smooth surface necessary for TFT fabrication.

Figures showing the various layers and structures used for the present invention are not to scale, but exaggerate relative thicknesses of various components for clarity of description.

Figure 1:
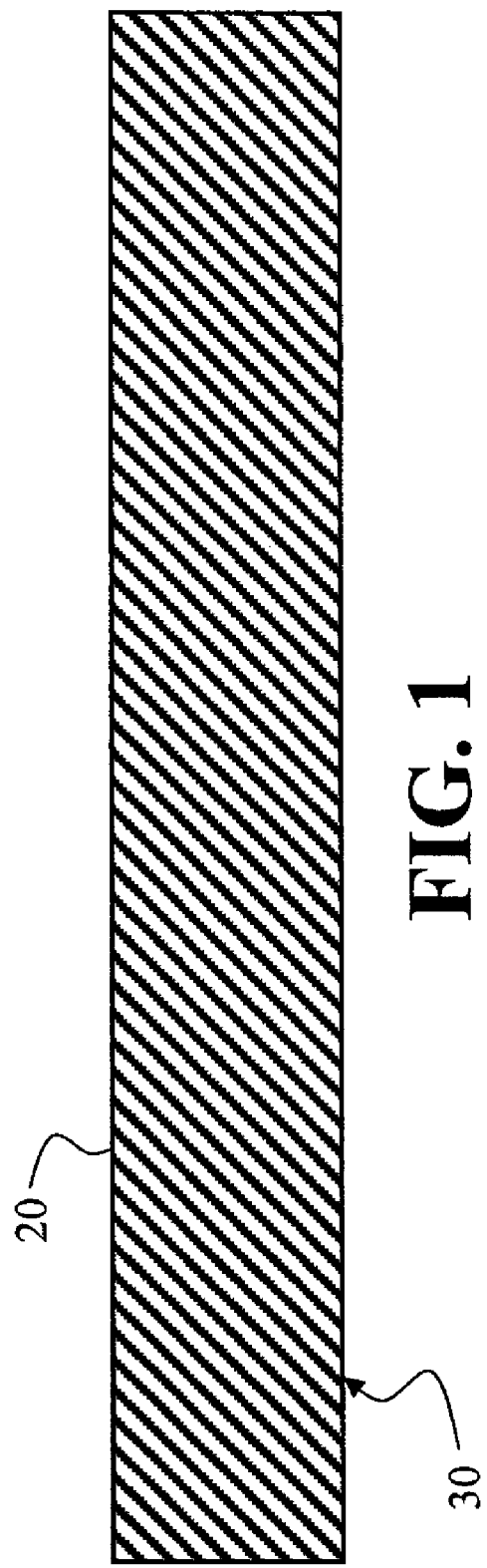
FIG. 1 is a cross section view showing a master.

The cross-sectional views of FIGS. 1 through 5 show, in sequence, a series of processes used to form a substrate having an electronic device 100. FIG. 1 is a cross section view showing a master 20 with a master surface 30. Master 20 is a material such as glass, quartz, or a metal having a highly polished surface 30 with a surface roughness of less than 400 nm, peak-to-peak. Master 20 may be a flat plate or may be a roller or have some other suitable surface shape.

Figure 2:
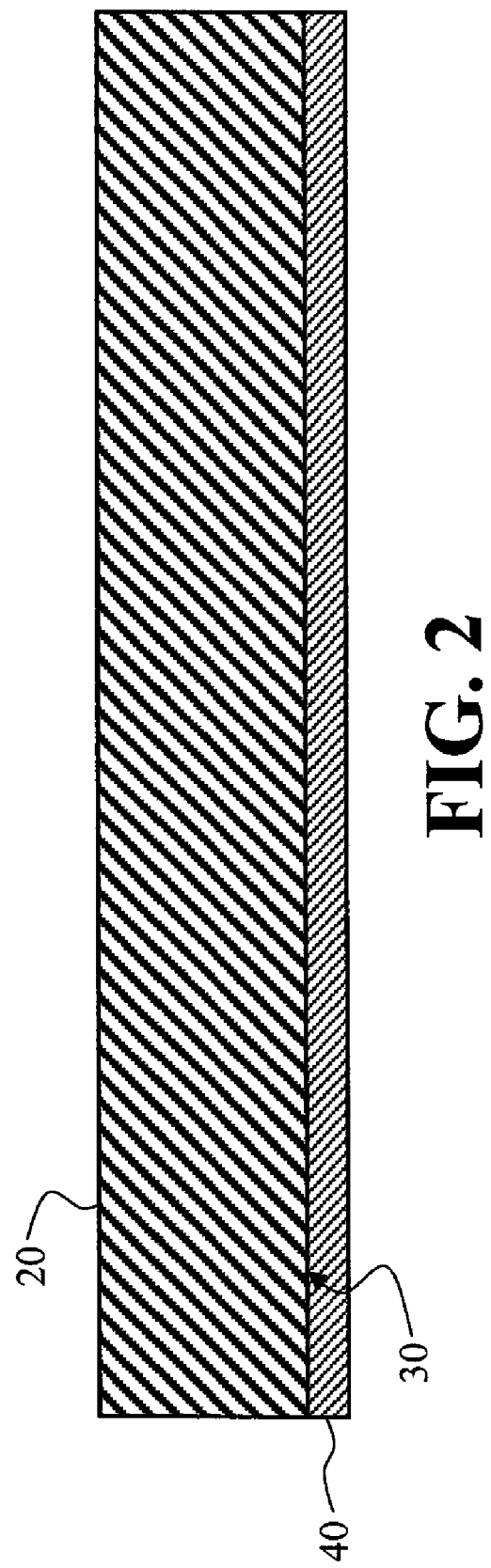
FIG. 2 is a cross-section view showing deposition of a seed layer onto the master.

FIG. 2 is a cross-section view showing deposition of a seed layer 40 onto master surface 30. Seed layer 40 can be formed using any of a number of deposition methods, such as atomic layer deposition (ALD), sputtering, or other method for forming a very thin seed layer 40. In one embodiment, seed layer 40 is a layer of chrome approximately 400 Angstroms thick. Chrome is advantaged for its suitability for bonding to other metals as well as for providing a surface suitable for fabrication of thin-film electronic devices. Other metals could be used, such as, aluminum, copper, indium, or nickel, for examples.

Figure 3:
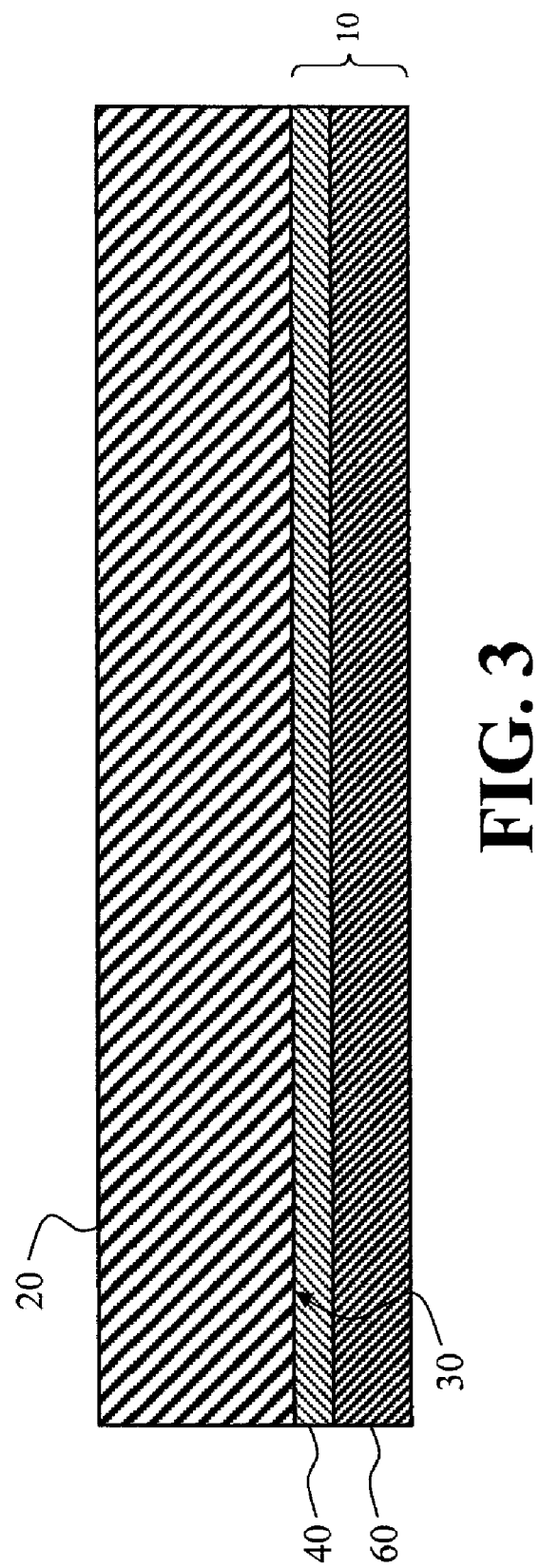
FIG. 3 is a cross-section view showing deposition of the metal support layer onto the seed layer.

Once seed layer 30 has been formed, the plating process shown in FIG. 3 is performed to form a metal substrate 10. Here, a supporting metal layer 60 is bonded to master surface 30. In one embodiment, supporting metal layer 60 is bonded by electroplating. Other plating or deposition methods could alternately be used such as, for example, plasma-based plating deposition, which operates using clouds of electron particles and ions. Still other available plating methods include thermal spray coating, vapor deposition, ion plating, and chemical vapor deposition (CVD), for example. The thickness of supporting metal layer 60 is determined by the application.

Various metals can be used for forming supporting metal layer 60. In one embodiment, nickel sulfamate is plated onto master surface 30 as metal layer 60. Electrodeposition methods for deposition of nickel sulfamate are described, for example, in U.S. Pat. No. 2,318,592 (Cupery). Other suitable metals for metal layer 60 may include copper, nickel, stainless steel, or aluminum, for example.

Figure 4:
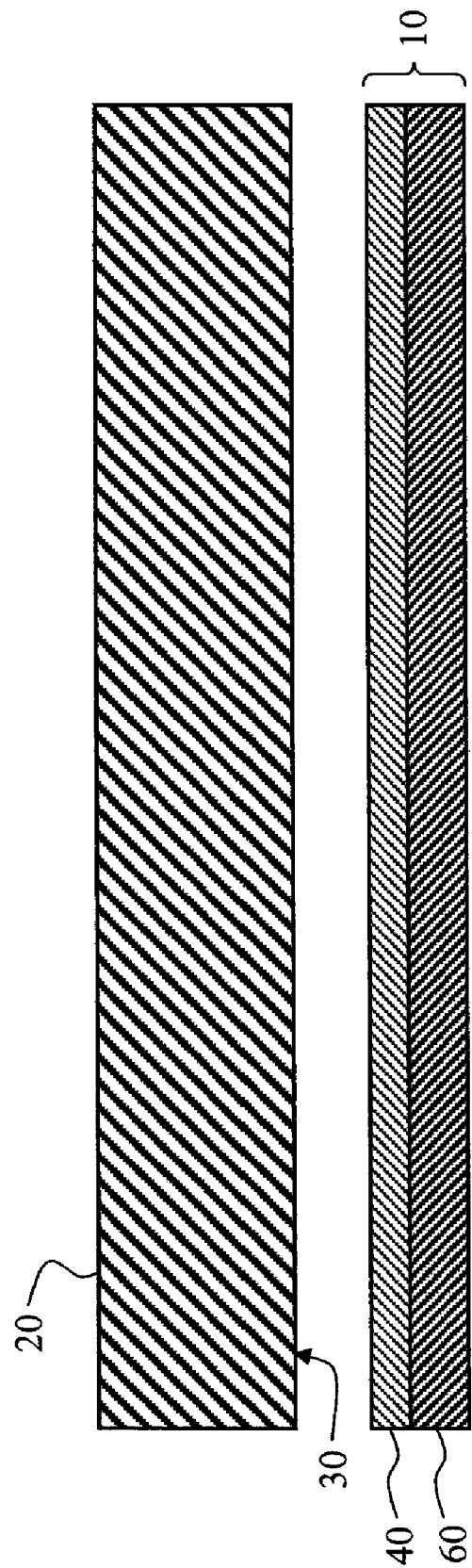
FIG. 4 is a cross section view showing removal of the seed layer from the master.

The next step, shown in the cross-section view of FIG. 4, is detachment of substrate 10 from master 20. Detachment can be performed using heat, for example.

It can be observed from the steps shown in FIGS. 1 through 5 that master surface 30 must be formed so that it is relatively free of imperfections, since metal seed layer 40 that is formed on it replicates master surface 30 in a manner similar to that performed by a mold. The slightest imperfection in master surface 30 will be replicated or amplified by seed layer 40.

Figure 5:
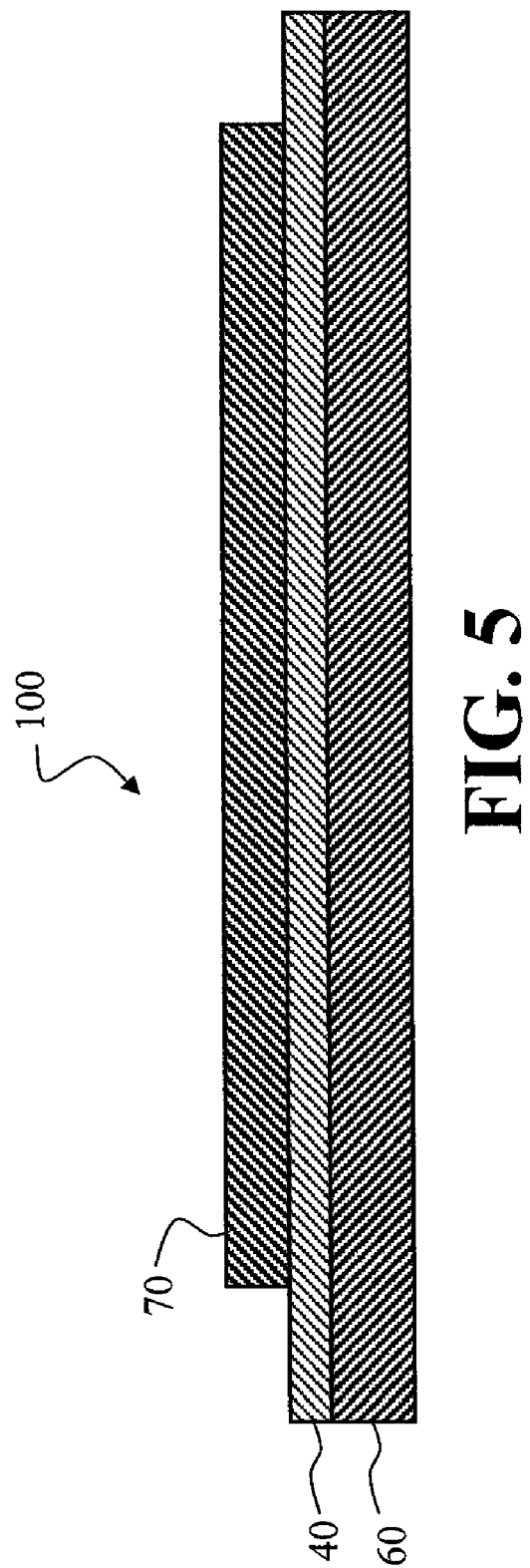
FIG. 5 is a cross section view showing formation of a TFT electronic device on the seed layer.

FIG. 5 is a cross section view showing formation of a TFT electronic device 70 on seed layer 40. Here, TFT electronic device 70 includes its own planarization layer and insulation layer, as necessary. However, planarization and insulation layers can be very thin when using the seed layer method of the present invention, since an extremely smooth surface can be obtained, minimizing the likelihood of shorts, edge effects, or other anomalies related to undesirable surface structure. In one embodiment, silicon nitride is used as part of TFT electronic device 70, both to seal and to insulate the surface to allow thin film deposition. In another embodiment, a supplemental thin layer of benzocyclobutene (BCB) or spun-on glass (SOG) is used for planarization beneath the TFT structure. Electronic device 70 could be formed by spin-coating a thin-film semiconductor material onto the surface of substrate 10. Following formation of electronic device 70, an optional patterning layer could be added to electronic device 70. Further processing could be used for forming a pattern in this optional patterning layer, such as light refractive structures, for example. Lens elements formed in such a way can be spatially aligned with thin-film electronic devices. Glass or plastic could be used for the optional patterning layer.

Figure 6:
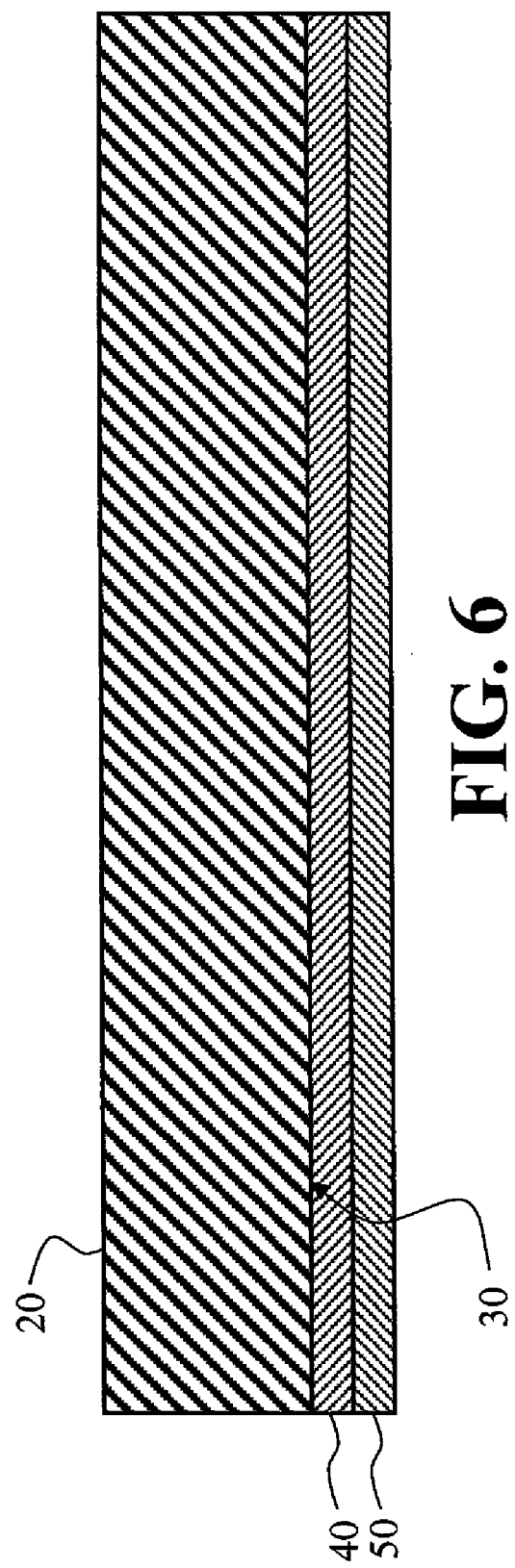
FIG. 6 is a cross section view showing an embodiment having multiple seed layers.

While a single seed layer may be used, as was described with reference to FIGS. 1-5, there may be advantages to the use of multiple seed layers. The cross-sectional views of FIGS. 6-9 show, in sequence, a series of processes used in another embodiment to form a substrate having an electronic device 100 wherein substrate 10 has multiple seed layers 40 and 50. FIG. 6 is a cross section view showing first seed layer 40 deposited on master surface 30 of master 20 with a master surface 30. In addition, second seed layer 50 is then deposited onto first seed layer 40. Second seed layer 50 may be, for example, a coating of sulfamate nickel, nickel, copper, aluminum, or other metal. The overall purpose of second seed layer 50 can be as an intermediate for bonding, to bond more effectively to both first seed layer 40 and supporting metal layer 60. Alternately, second seed layer 50 could be glass or some other suitable dielectric insulation material. Second seed layer 50 could provide the function of a plane for shielding or ground connection, for example.

Figure 7:
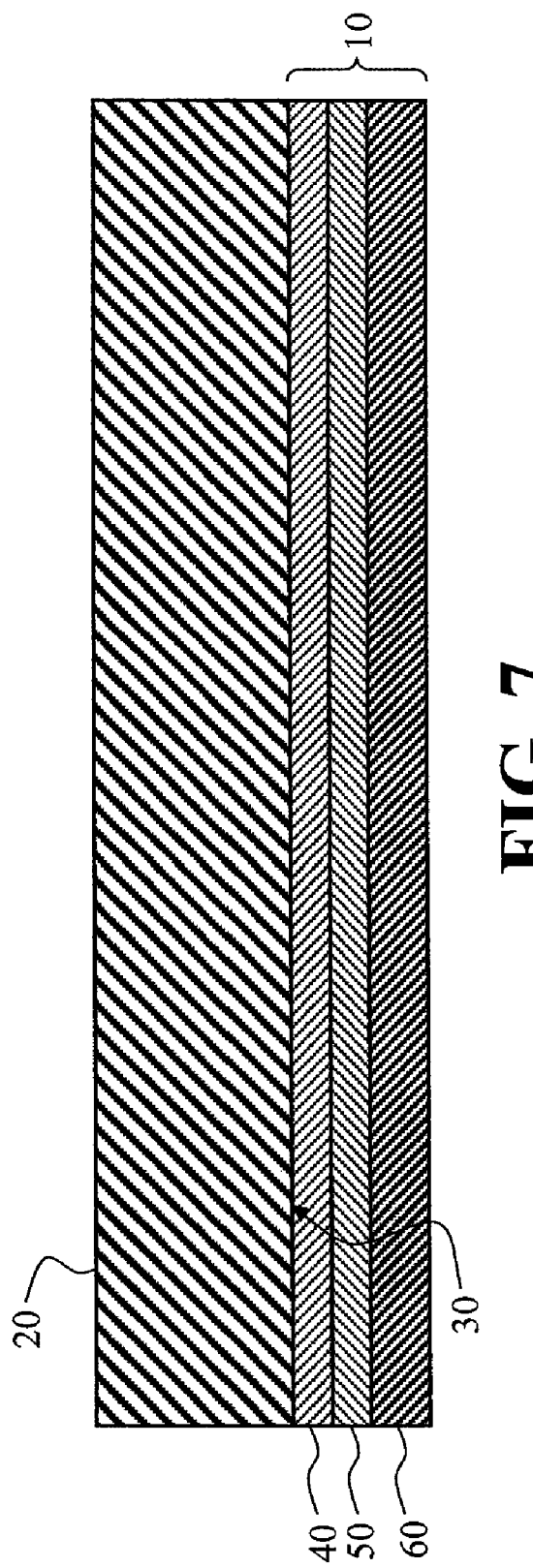
FIG. 7 is a cross section view showing a metal support layer attached to a second seed layer.

FIG. 7 is a cross section view showing a metal support layer attached to a second seed layer to form substrate 10. The same bonding methods described earlier with reference to FIG. 3 could be used, including electroplating, for example.

Figure 8:
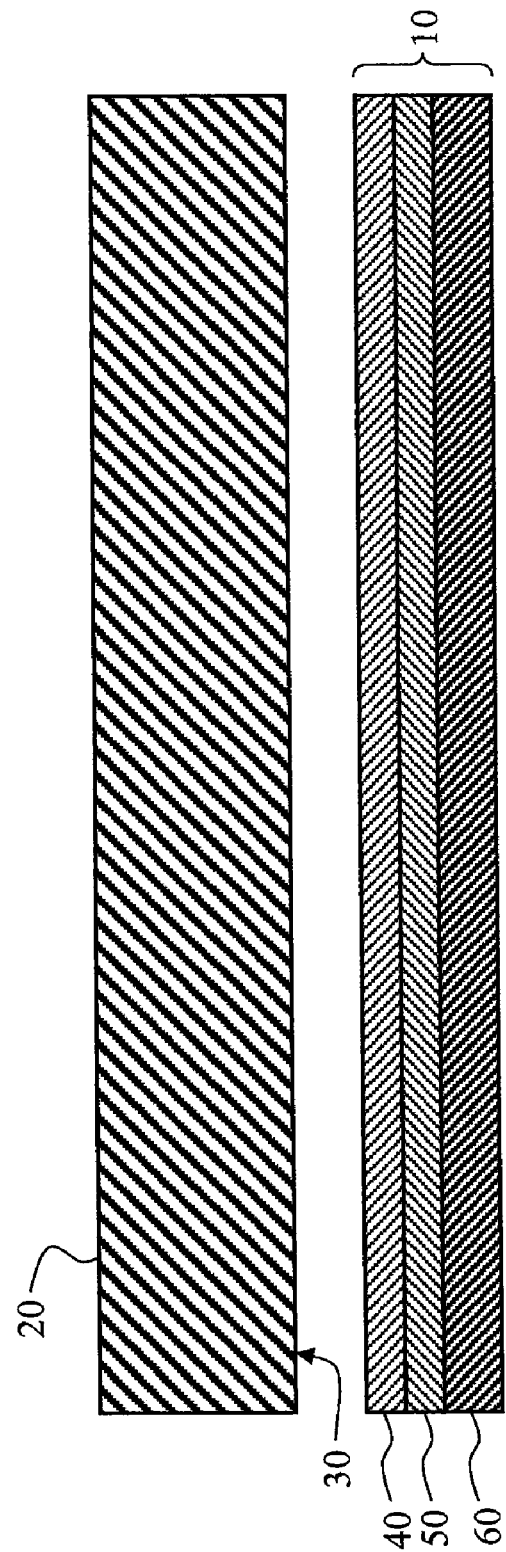
FIG. 8 is a cross-section view showing detachment of the substrate from the master surface in one embodiment.

The next step, shown in the cross-section view of FIG. 8, is detachment of substrate 10 from master 20. Detachment can be performed using peeling or heat, for example. Chemical methods could also be used to effect detachment.

Figure 9:
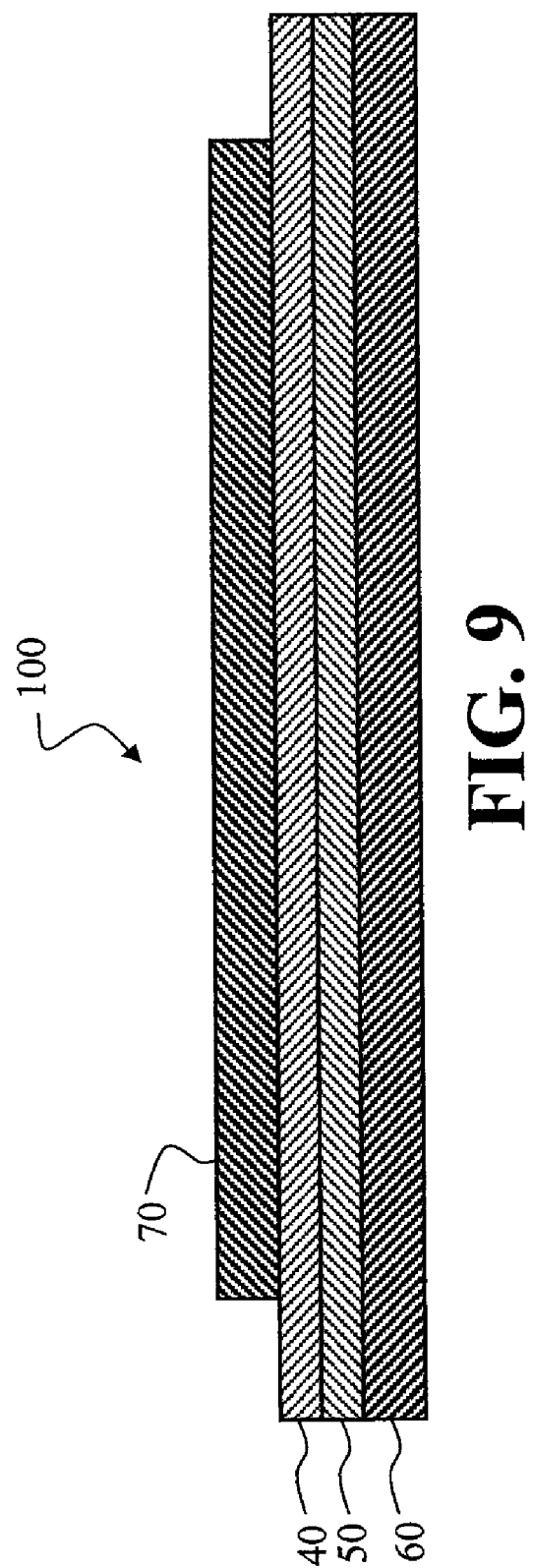
FIG. 9 is a cross-section view showing formation of a TFT electronic device on the first seed layer in an embodiment with multiple seed layers.

FIG. 9 is a cross section view showing formation of a TFT electronic device 70 on seed layer 40. In the embodiment of FIG. 9, TFT electronic device 70 includes its own planarization layer and insulation layer, as necessary. However, as was noted with respect to FIG. 5, planarization and insulation layers can be very thin when using the seed layer method of the present invention, since an extremely smooth surface can be obtained, minimizing the likelihood of shorts, edge effects, or other anomalies related to undesirable surface structure.

Figure 10:
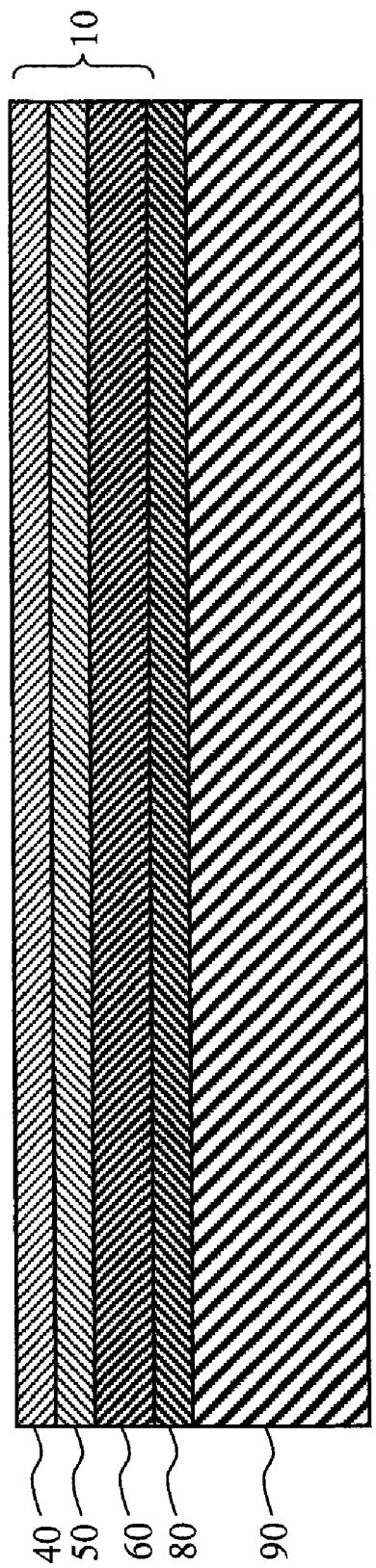
FIG. 10 is a cross-section view of an embodiment of the substrate of the present invention laminated to a carrier.
Figure 11:
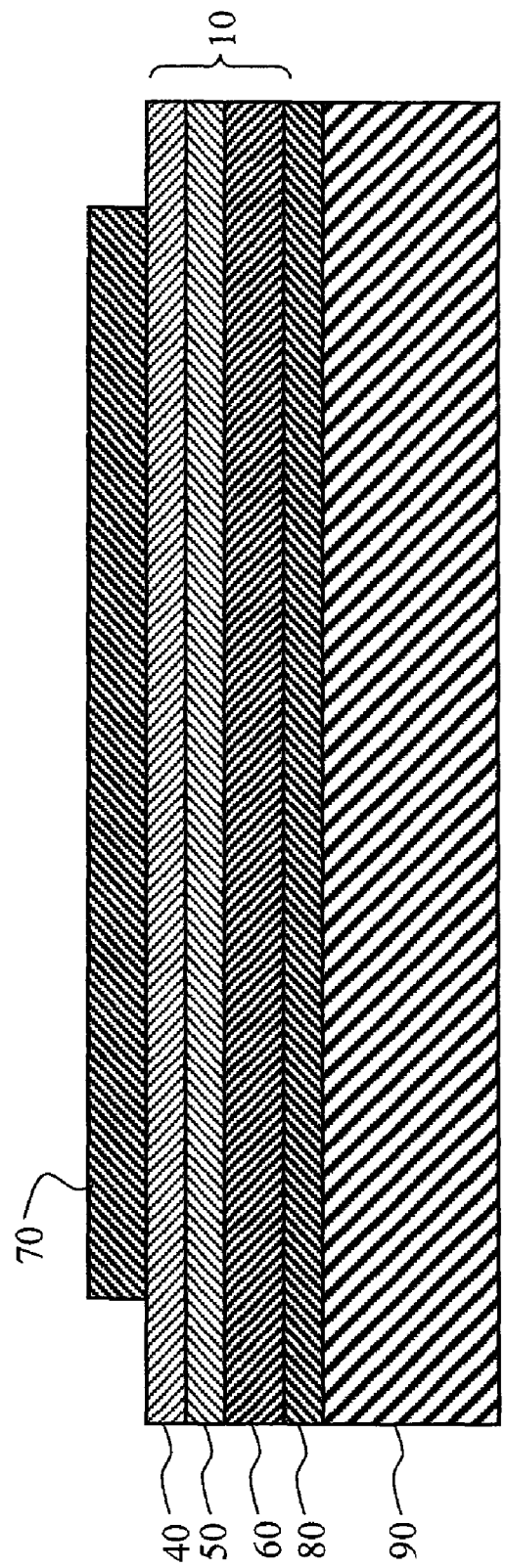
FIG. 11 is a cross-section view showing an electronic device formed on the first seed layer in an embodiment having multiple seed layers coupled to a carrier.
Figure 12:
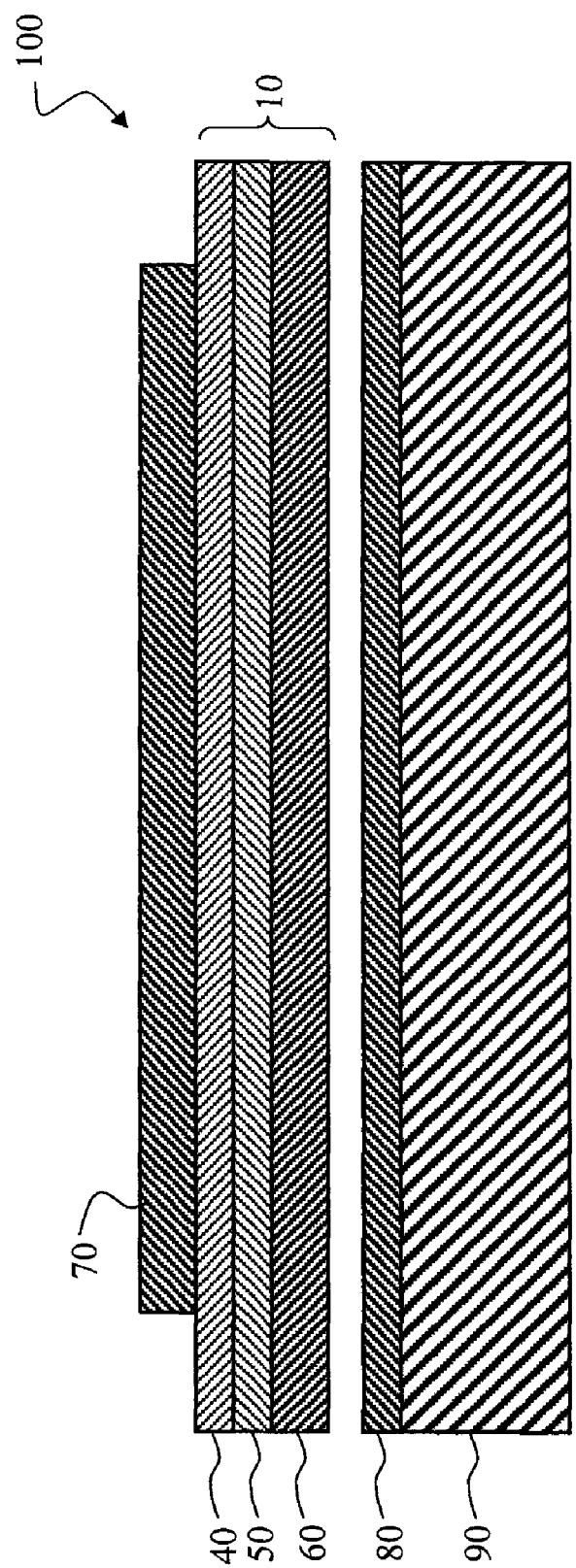
FIG. 12 shows detachment, from the carrier, of the substrate having an electronic device.

FIGS. 10 through 12 expand on basic steps used to form TFT electronic device 70 in one embodiment. Here, a carrier 90 is used as a temporary structure for supporting substrate 10 during TFT fabrication. A lamination material 80 provides the temporary bond needed between carrier 90 and substrate 10. Then, as shown in FIG. 11, electronic device 70 can be formed on substrate 10 while supported by carrier 90. Carrier 90 is typically glass, metal, or other very flat, rigid material.

As shown in FIG. 12, a final step in TFT fabrication is then removal of substrate 10 with electronic device 70 from carrier 90, thereby forming substrate having electronic device 100. Typically mechanical peeling, heat, or chemical agents are used to detach substrate 10 from carrier 90.

Figure 13:
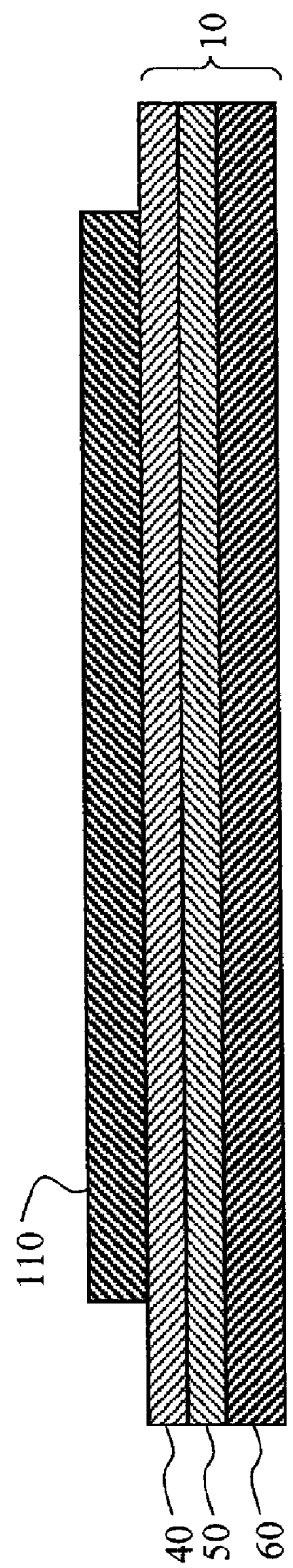
FIG. 13 is a cross-section view showing a planarization layer formed on the substrate according to one embodiment.
Figure 14:
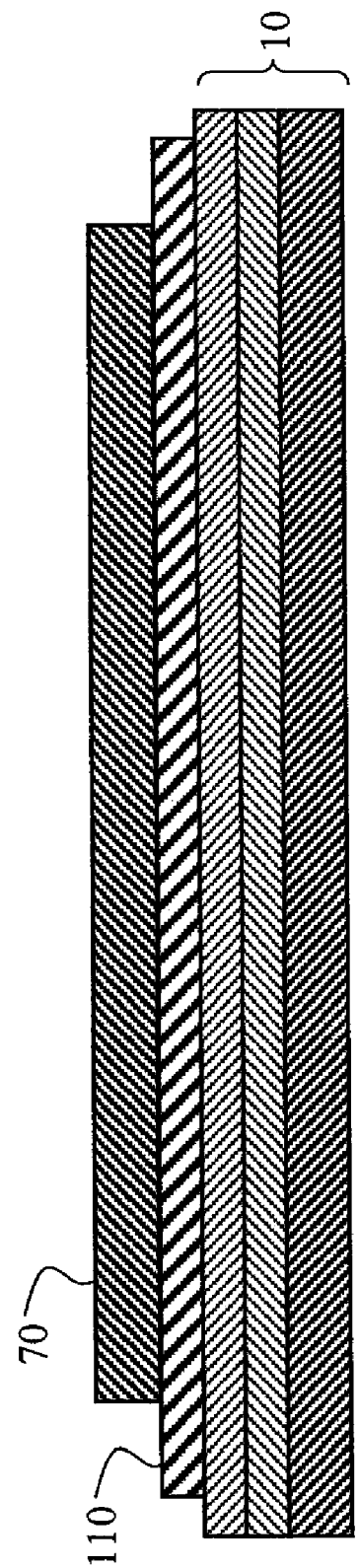
FIG. 14 is a cross-section view showing an electronic device formed on the planarization layer.

As an alternate embodiment, FIGS. 13 and 14 show a sequence of steps that provide a separate planarization layer 110 on substrate 10, prior to forming TFT electronic device 70. In one embodiment, planarization layer 110 is silicon nitride, used both to seal and insulate the surface to allow thin film deposition. In another embodiment, a supplemental layer of benzocyclobutene (BCB) or spun-on glass (SOG) is used for forming planarization layer 110. Alternately, Tetraethoxysilane (TEOS) or acrylic materials could be used for planarization. Planarization layer 110 could optionally include a colorant, a light absorber, a light filter, or a reflector. FIG. 14 is a cross-section view showing electronic device 70 formed on planarization layer 110.

Alternately, an isolation layer could be used, either in the place of or in addition to planarization layer 110 as shown in FIG. 13. A suitable isolation layer material can be SiO2, SiNx, SiON, or some combination of these materials. Thickness of this layer is typically in the range from about 0.5 to 1.5 μm.

Figure 15:
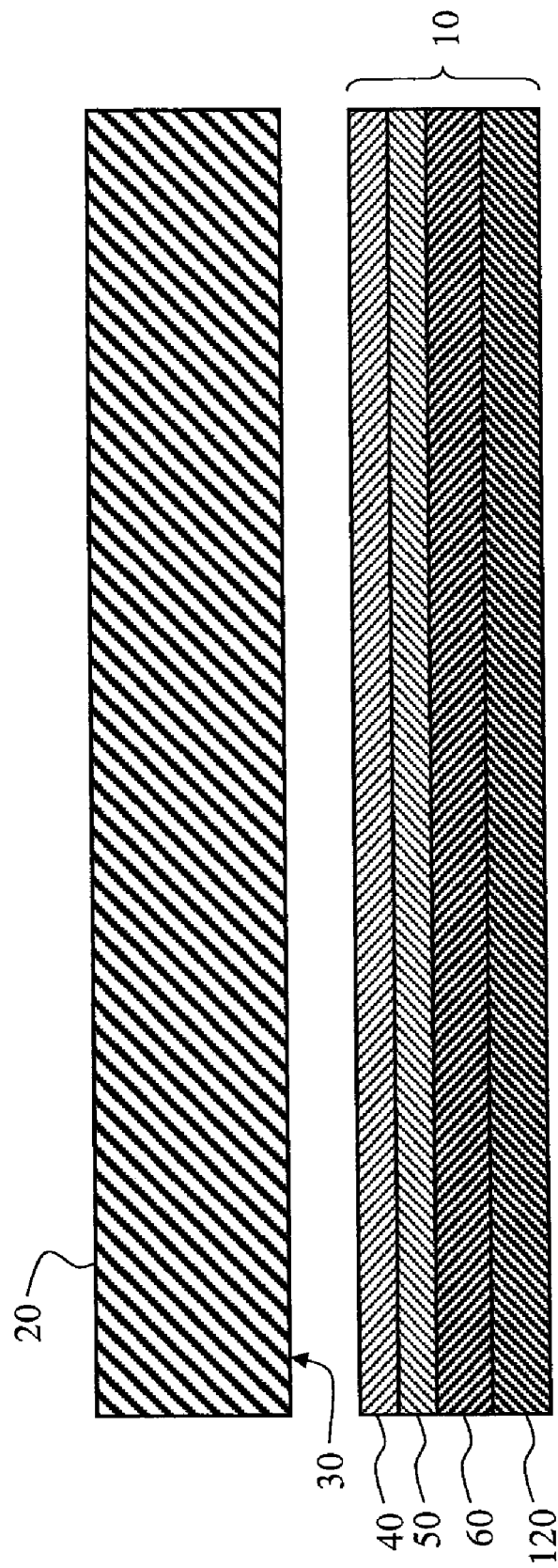
FIG. 15 is a cross-section view showing a substrate of the present invention with a backer plate in one embodiment.

FIG. 15 shows an alternate embodiment in which a backer plate 120 is attached to supporting metal layer 60 as a stiffener. In one embodiment, backer plate 120 is a plastic material; however, other materials such as metal, composite materials including fiberglass composites, or other suitable stiffeners could be attached to supporting metal layer 60. Thickness of backer plate 120 can be, for example, in the range from about 0.5 mm to about 3 mm, depending on the intended application. This allows supporting metal layer 60 to be as thin as possible, while still providing sufficient support to the fabricated substrate 10. In fabrication, backer plate 120 is attached prior to separation from master 20 in one embodiment.

Electronic device 70 that is formed on substrate 10 can be used to provide signals to or from any of a number of different types of components and would have particular applications for image display pixels or image sensing pixels. For example, the electronic device formed on the substrate 10 surface can be coupled with a corresponding liquid crystal pixel, light-emitting diode pixel, or organic light-emitting diode pixel for display, for example. For image sensing, the electronic device formed on the substrate 10 surface can be coupled with a stimulable phosphor pixel or with another type of sensor pixel, including a biological detector.

The method of the present invention is particularly well adapted for roll-to-roll manufacturing, or web fabrication, processing. Master 20 could be provided from a roll, a roller, or a belt, such as an endless belt, for example. Alternately, substrate 10 could be wrapped about a roll following its manufacture.

The invention has been described in detail with particular reference to certain preferred embodiments thereof, but it will be understood that variations and modifications can be effected within the scope of the invention.

PARTS LIST 10 substrate
20 master
30 master surface
40 first seed layer
50 second seed layer
60 supporting metal layer
70 electronic device
80 lamination material
90 carrier
100 substrate having electronic device
110 planarization layer
120 backer plate

The invention claimed is:

1. A method of forming a semiconductor device on a metal substrate comprising:
    providing a master having a master surface with a roughness of less than 400 nm, peak-to-peak;
    depositing a first seed layer of a first metal on the master surface of the master to form a substantially planar surface of the first seed layer proximate the master surface;
    bonding a supporting metal layer to the first seed layer on a surface opposite the substantially planar surface, the seed layer and the metal layer comprising the metal substrate;
    removing the metal substrate from the master to expose the substantially planar surface;
    forming at least one semiconductor device on the exposed substantially planar surface, such that the first seed layer is not disposed between the at least one semiconductor and the exposed substantially planar surface;
    applying a patterning layer to said semiconductor device; and
    forming a pattern in said patterning layer.

2. The method of claim 1 wherein forming a pattern comprises embossing.

3. The method of claim 1 wherein the pattern comprises one or more lens elements.

4. The method of claim 1 wherein the one or more lens elements are spatially aligned with the semiconductor devices formed on said surface.

5. The method of claim 1, wherein the semiconductor device is a thin film transistor.

6. A method as in claim 1 comprising the additional step of: depositing a second seed layer of a second metal on the first seed layer.

7. The method as in claim 1 wherein the first metal is chrome.

8. The method of claim 1 wherein said semiconductor device comprises one or more thin film transistors.

9. The method as in claim 1 wherein said supporting metal layer is a nickel sulfate or a nickel compound.

10. The method as in claim 1 wherein said supporting metal layer is bonded by electroplating.

11. The method as in claim 1 wherein said supporting metal layer is bonded by plasma deposition.

12. The method as in claim 1 wherein said supporting metal layer is stainless steel.

13. The method as in claim 1 wherein removing said metal substrate comprises applying heat.

14. The method of claim 1 wherein the step of forming at least one semiconductor device further comprises spin coating a thin-film semiconductor material onto the exposed substantially planar surface.

15. The method of claim 1 further comprising depositing a dielectric material onto the exposed substantially planar surface prior to forming said at least one semiconductor device.

16. The method of claim 1 further comprising attaching the substrate with said at least one semiconductor device onto another device.

17. The method of claim 1 further comprising attaching the substrate with said at least one semiconductor device onto a rigid support.

18. The method of claim 1 further comprising coupling the semiconductor with a liquid crystal pixel.

19. The method of claim 1 further comprising coupling the semiconductor device with a light-emitting diode pixel.

20. The method of claim 1 further comprising coupling the semiconductor device with an organic light-emitting diode pixel.

* * * * *